(12) United States Patent
Lee et al.

(10) Patent No.: US 7,923,287 B2
(45) Date of Patent: Apr. 12, 2011

(54) THIN FILM TRANSISTOR SUBSTRATE HAVING TRANSPARENT CONDUCTIVE METAL AND METHOD OF MANUFACTURING THE SAME

(75) Inventors: Eun-Guk Lee, Yongin-si (KR); Do-Hyun Kim, Seoul (KR); Chang-Oh Jeong, Suwon-si (KR); Je-Hun Lee, Seoul (KR); Soon-Kwon Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 433 days.

(21) Appl. No.: 12/001,031

(22) Filed: Dec. 6, 2007

(65) Prior Publication Data

US 2008/0142797 A1    Jun. 19, 2008

(30) Foreign Application Priority Data

Dec. 14, 2006    (KR) .................. 10-2006-0127671

(51) Int. Cl.
*H01L 21/84* (2006.01)
*H01L 29/786* (2006.01)

(52) U.S. Cl. ...... 438/104; 257/72; 257/43; 257/E27.116

(58) Field of Classification Search .............. 438/104
See application file for complete search history.

(56) References Cited

U.S. PATENT DOCUMENTS

| 6,727,522 B1 * | 4/2004 | Kawasaki et al. ............. 257/103 |
| 6,933,568 B2 * | 8/2005 | Yang et al. .................... 257/347 |
| 2005/0199960 A1 | 9/2005 | Hoffman et al. |

FOREIGN PATENT DOCUMENTS

| CN | 101335274 A | 12/2008 |
| JP | 2002-76356 | 3/2002 |
| JP | 2004-273614 | 9/2004 |
| JP | 2006-173580 | 6/2006 |

OTHER PUBLICATIONS

Patent Abstracts of Japan, Publication No. 2002-076356, Mar. 15, 2002, 2 pp.
Patent Abstracts of Japan, Publication No. 2004-273614, Sep. 30, 2004, 2 pp.
Patent Abstracts of Japan, Publication No. 2006-173580, Jun. 29, 2006, 1 p.

* cited by examiner

*Primary Examiner* — Jerome Jackson, Jr.
(74) *Attorney, Agent, or Firm* — Innovation Counsel LLP

(57) ABSTRACT

A thin film transistor substrate and a method of manufacturing the same are disclosed. The method of manufacturing a thin film transistor substrate includes forming a first conductive pattern group including a gate line, a gate electrode, and a lower gate pad electrode on a substrate, forming a gate insulating layer on the substrate on which the first conductive pattern group is formed, forming an oxide semiconductor pattern overlapping the gate electrode on the gate insulating layer, and forming first and second conductive layers on the substrate on which the oxide semiconductor pattern is formed and patterning the first and second conductive layers to form a second conductive pattern group including a data line, a source electrode, a drain electrode, and a data pad.

17 Claims, 25 Drawing Sheets

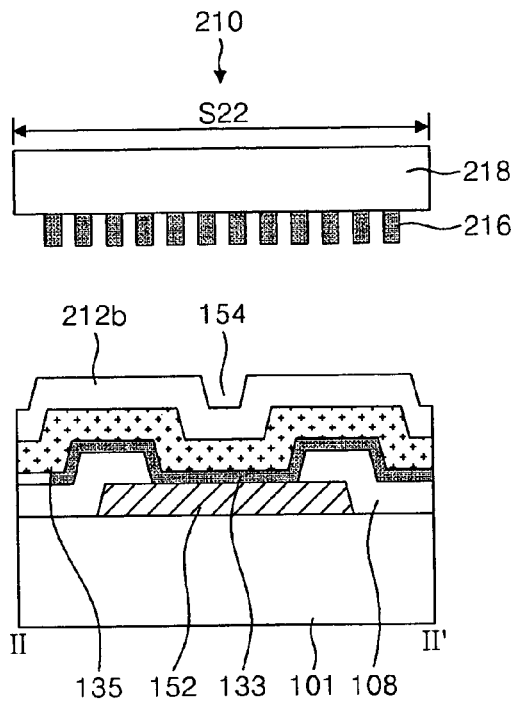
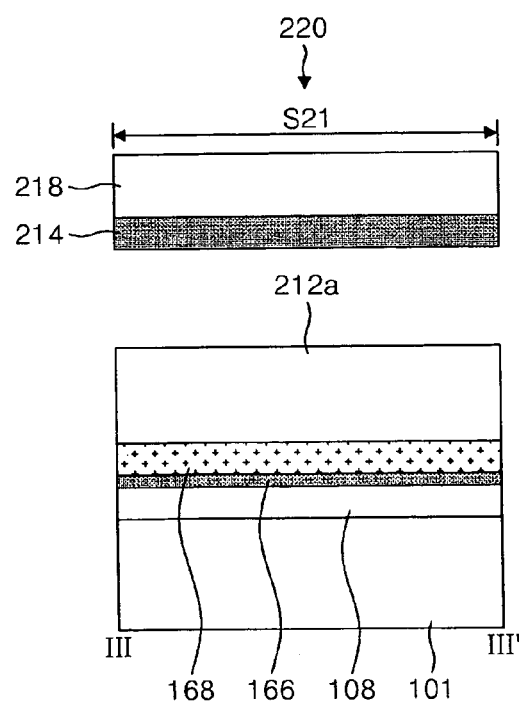

THIN FILM TRANSISTOR SUBSTRATE HAVING TRANSPARENT CONDUCTIVE METAL AND METHOD OF MANUFACTURING THE SAME

CROSS REFERENCE TO RELATED APPLICATIONS

This application claims priority under 35 U.S.C. §119 to Korean Patent Application No. 10-2006-0127671 filed on Dec. 14, 2006 in the Korean Intellectual Property Office, the contents of which are herein incorporated by reference in their entirety.

BACKGROUND OF THE INVENTION

1. Field of the Invention

The present invention relates to a thin film transistor, a thin film transistor substrate and a simplified method of manufacturing the same, which provides a liquid crystal display device having high resolution.

2. Description of the Related Art

A liquid crystal display ("LCD") device displays an image by adjusting optical transmittance of liquid crystals having dielectric anisotropy by using an electric field. The LCD device includes an LCD panel having the liquid crystals aligned in a form of an active matrix and a driving circuit for driving the LCD panel.

The LCD panel includes a color filter substrate and a thin film transistor substrate bonded to the color filter substrate by a sealant with the liquid crystals disposed therebetween.

The color filter substrate typically includes a black matrix, a color filter and a common electrode, stacked on an insulating substrate.

The thin film transistor substrate includes gate and data lines provided to intersect each other on a lower insulating substrate and a thin film transistor ("TFT") connecting a pixel electrode and the gate and data lines. The TFT supplies a data signal from the data line to the pixel electrode in response to a scanning signal from the gate line. TFTs typically use amorphous silicon, polysilicon or a zinc oxide based substance as an active layer. The TFT using amorphous silicon can be manufactured at a low temperature, which has low mobility and fails to meet a condition of a constant current. The TFT using the polysilicon has high mobility and meets the condition of the constant current. However, the TFT using the polysilicon has difficulty in achieving a large scale due to its poor uniformity and needs a high temperature process. On the other hand, the TFT which includes a zinc oxide based semiconductor layer can be manufactured by a low temperature process and has appropriate mobility, satisfying the condition of the constant current.

However, the TFT including the oxide semiconductor layer employs transparent electrodes of ITO (indium tin oxide), Au or the like for source/drain electrodes. When the source/drain electrodes are formed of the transparent electrodes and a large area is covered, the resistance rises to bring about a considerable signal delay.

Moreover, when the source/drain electrodes are formed of Au, the material cost is increased.

BRIEF SUMMARY OF THE INVENTION

The present invention provides a thin film transistor, a thin film transistor substrate and a method of manufacturing the same, where high resolution and large scale can be provided and a manufacturing process can be simplified.

In one exemplary embodiment, a method of manufacturing a thin film transistor substrate includes forming a first conductive pattern group including a gate line, a gate electrode, and a lower gate pad electrode on a substrate, forming a gate insulating layer on the substrate on which the first conductive pattern group is formed, forming an oxide semiconductor pattern overlapping the gate electrode on the gate insulating layer, and forming first and second conductive layers on the substrate on which the oxide semiconductor pattern is formed and patterning the first and second conductive layers to form a second conductive pattern group including a data line, a source electrode, a drain electrode, and a data pad.

In another exemplary embodiment, a thin film transistor substrate includes a gate line and a gate electrode formed on a substrate, a gate insulating layer formed on the gate line and the gate electrode, an oxide semiconductor layer overlapping the gate electrode on the gate insulating layer, a data line, a source electrode, and a drain electrode formed of first and second conductive layers on the oxide semiconductor layer and the gate insulating layer, and a pixel electrode connected to the drain electrode and formed of the first conductive layer.

In still another exemplary embodiment, a thin film transistor includes a gate electrode, a gate insulating layer formed on the gate electrode, an oxide semiconductor layer overlapping the gate electrode on the gate insulating layer, and a source electrode and a drain electrode formed of first and second conductive layers on the oxide semiconductor layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the invention. In the drawings:

FIGS. 14A, 14B, 14C, 15A, 15B, 15C, 16A, 16B, 16C, 17A, 17B, and 17C are cross-sectional views useful for explaining in detail the method of manufacturing the TFT substrate shown in FIGS. 13A, 13B, and 13C.

DETAILED DESCRIPTION OF THE INVENTION

Exemplary embodiments of the present invention are described with reference to the accompanying drawings in detail. The same reference numbers are used throughout the drawings to refer to the same or like parts. Detailed descriptions of well-known functions and structures incorporated herein are omitted to avoid obscuring the subject matter of the present invention.

The present invention may be embodied in many different forms. Specific embodiments of the invention are shown in drawings and described herein in detail, and it is understood that the present disclosure does not limit the invention to the specific embodiments illustrated.

Figure 1:
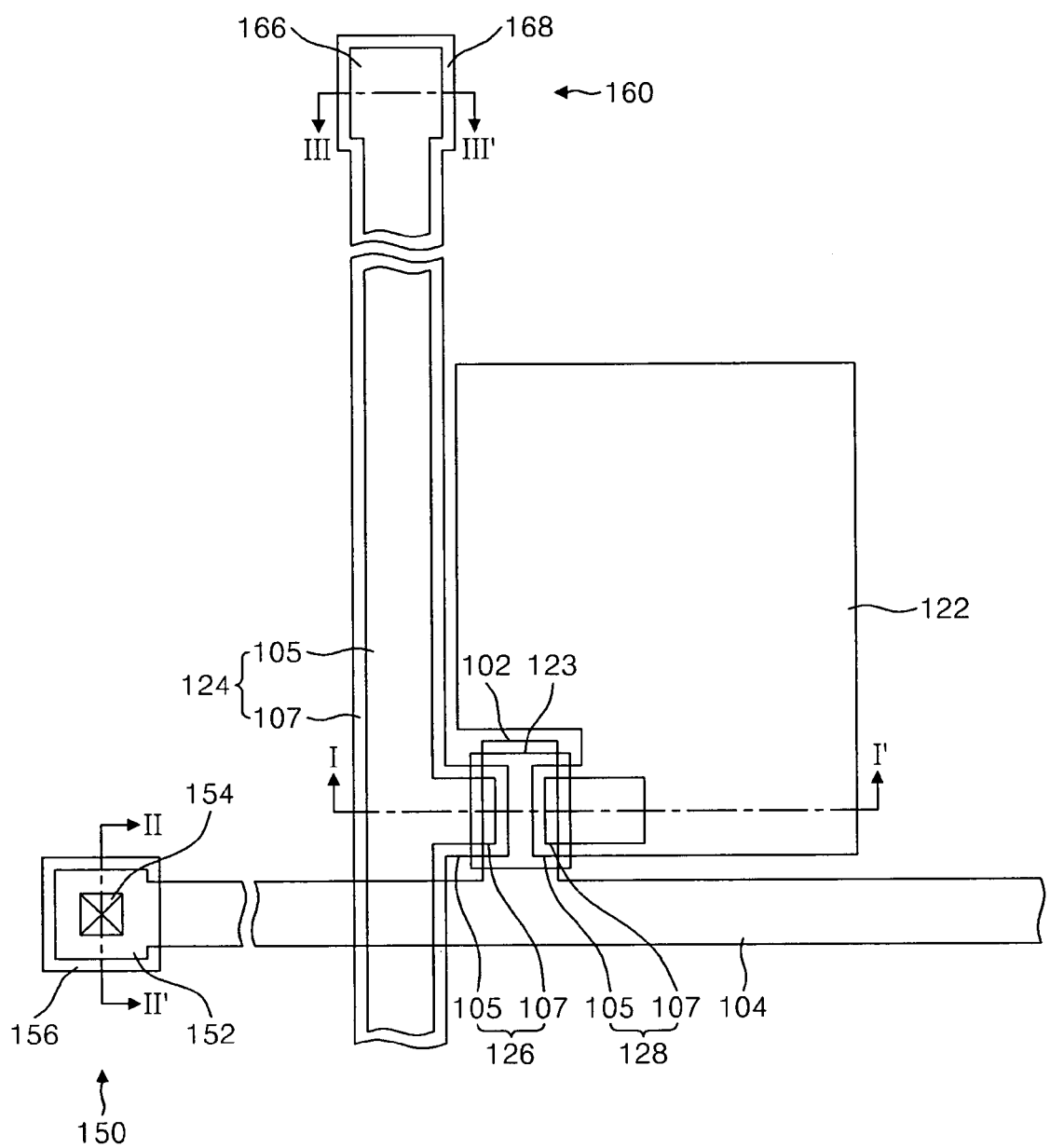
FIG. 1 is a plan view of a TFT substrate according to an embodiment of the present invention.
Figure 2A:
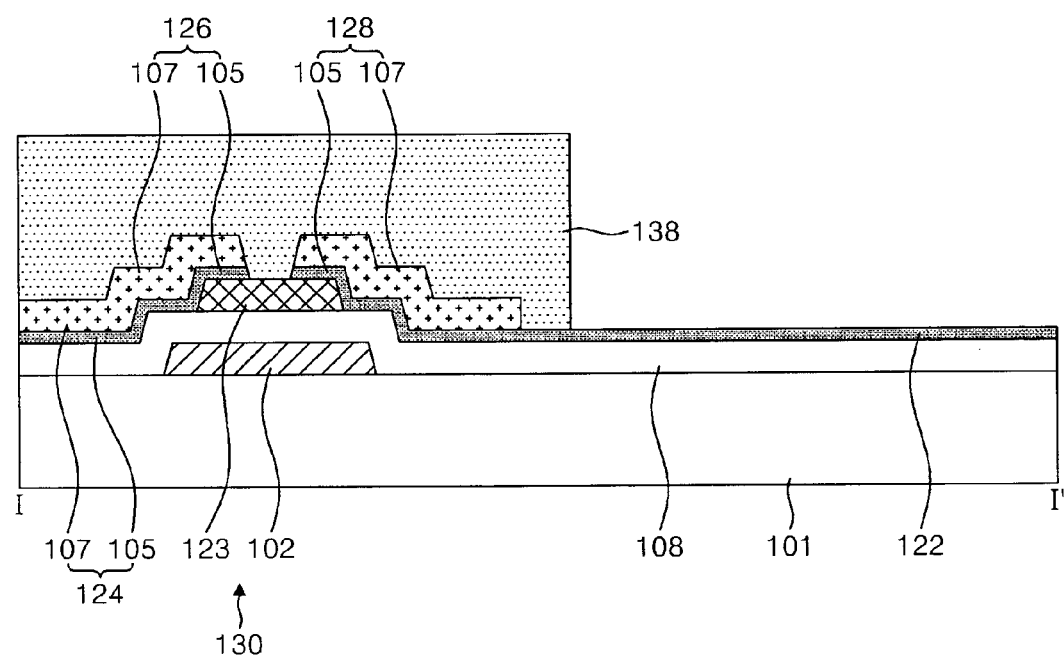
FIGS. 2A, 2B, and 2C are cross-sectional views of the TFT substrate taken along lines I-I', II-II', and III-III' respectively of FIG. 1.
Figure 2B:
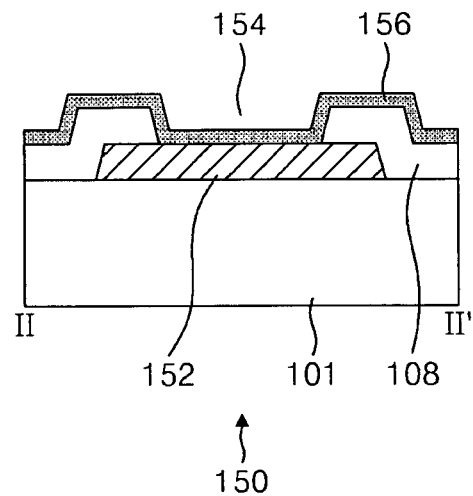
Figure 2C:
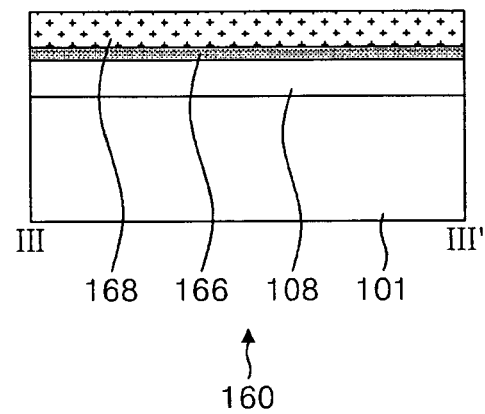

FIG. 1 is a plan view of a TFT substrate according to an embodiment of the present invention, and FIGS. 2A, 2B, and 2C are cross-sectional views of the TFT substrate taken along lines I-I', II-II', and III-III', respectively of FIG. 1.

Referring to FIGS. 1, 2A, 2B, and 2C, a TFT substrate according to an embodiment of the present invention includes gate and data lines 104 and 124 which intersect each other on a lower substrate 101 with a gate insulating layer 108 disposed therebetween. TFT 130 is formed at the intersection of the gate and data lines 104 and 124 respectively. A pixel electrode 122 is formed in a sub-pixel area of the intersection and connected to the TFT 130, a gate pad 150 connected to the gate line 104, and a data pad 160 connected to the data line 124.

The TFT 130 enables the pixel electrode 122 to be charged with a pixel signal supplied to the data line 124 in response to a scanning signal of the gate line 104. TFT 130 includes a gate electrode 102 connected to the gate line 104, a source electrode 126 connected to the data line 124, a drain electrode 128 connected to the pixel electrode 122 and opposed to the source electrode 126, and an oxide semiconductor layer 123 overlapping the gate electrode 102 with the gate insulating layer 108 disposed therebetween to form a channel between the source and drain electrodes 126 and 128 respectively. The oxide semiconductor layer 123 contains zinc oxide (ZnO) as a zinc oxide based substance for example. Alternatively, the oxide semiconductor layer 123 may further include materials such as In and Ga, in addition to ZnO. For instance, the oxide semiconductor layer 123 may include GaZnO, InZnO or GaInZnO. A component ratio of Ga, In, and Zn may be set to 1:1:1 or 2:2:1. The gate line 104 supplies a scanning signal supplied via the gate pad 150 to the gate electrode 102 of the TFT 130. Both of the gate line 104 and the gate electrode 102 may be formed of a non-transparent metal layer on the lower substrate 101. For this, the non-transparent metal layer may include Cu, Mo, Al, Cu alloy, Mo alloy, or Al alloy.

The data line 124 intersects the gate line 104 to define a pixel area and supply a pixel signal via the data pad 160 to the source electrode 126 of the TFT 130.

Each of the data line 124 and the source and drain electrodes 126 and 128 of the TFT 130 may be formed in a multi-layered structure having at least two layers including a transparent conductive layer. For instance, each of the data line 124, the source electrode 126 and the drain electrode 128 may include a first conductive layer 105 formed of a transparent conductive layer and a second conductive layer 107 formed of a low-resistance metal to form the multi-layered structure. The first conductive layer 105 may be formed of, for example, p-ITO (Polycrystalline Indium Tin Oxide), indium tin oxide (ITO) or indium zinc oxide (IZO), and the second conductive layer 107 may be formed of Cu, Mo, Al, Ti, Al—Ni alloy, Cu alloy, Mo alloy, or Al alloy.

The first conductive layer 105 included in the source and drain electrodes 126 and 128 facilitates contact with the oxide semiconductor layer 123. The source electrode 126 and the drain electrode 128 may include a first conductive layer 105 formed of a transparent conductive layer and a second conductive layer 107 formed of a low-resistance metal to form the multi-layered structure, thereby preventing resistance from increasing in case of a large-scale TFT substrate. The second conductive layer 107 included in the source and drain electrodes 126 and 128 may be formed of low-resistance metal such as those described above to prevent a delay of a video signal.

The first conductive layer 105 of the drain electrode 128 is extended on the gate insulating layer 108 to form the pixel electrode 122. In this case, the pixel electrode 122 is integral with the drain electrode 128. When a video signal is supplied via the TFT 130 to the pixel electrode 122, the pixel electrode 122 generates an electric field together with the common electrode to which a common voltage is supplied and rotates liquid crystal molecules aligned between the TFT and color filter substrates according to dielectric anisotropy. Transmittance of light passing through the pixel area varies according to a rotational degree of the liquid crystal molecules, thereby presenting a gray scale.

The gate pad 150 is connected to a gate driver (not shown) to supply a scanning signal from the gate driver to the gate line 104. As shown in FIG. 2B, the gate pad 150 includes a lower gate pad electrode 152 extending from the gate line 104 and an upper gate pad electrode 156 connected to the lower gate pad electrode 152 via a gate pad contact hole 154 passing through the gate insulating layer 108.

The data pad 160 is connected to a data driver (not shown) to supply a pixel signal from the data driver to the data line 124. As shown in FIG. 2C, the data pad 160 includes a lower data pad electrode 166 formed of the first conductive layer 105 extending from the data line 124 on the gate insulating layer 108 and an upper data pad electrode 168 formed of the second conductive layer 107.

As shown in FIG. 2A, a column spacer 138 provides a sufficient liquid crystal dropping margin by being compressively transformed when bonding the color filter and the TFT substrate together by thermal pressurization. And the column spacer 138 prevents a wall of the black matrix from being in direct contact with the TFT substrate. The column spacer 138 is formed by performing an organic layer process on the lower substrate 101 having the TFT 130. Accordingly, deposition and etching processes are not required to form the column spacer 138, thereby simplifying a manufacturing process.

FIGS. 3 to 19C are plan views and cross-sectional views to explain a TFT substrate according to the present invention.

Figure 3:
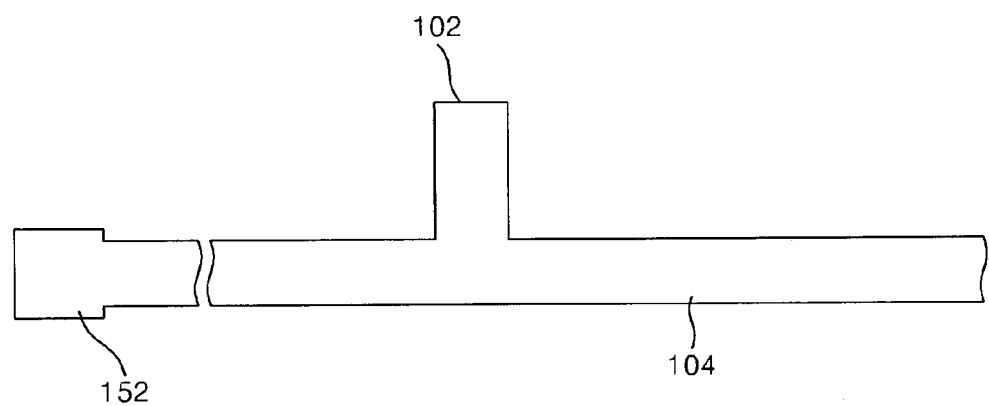
FIG. 3 is a plan view of a gate line 104 including gate electrode 102.
Figure 4A:
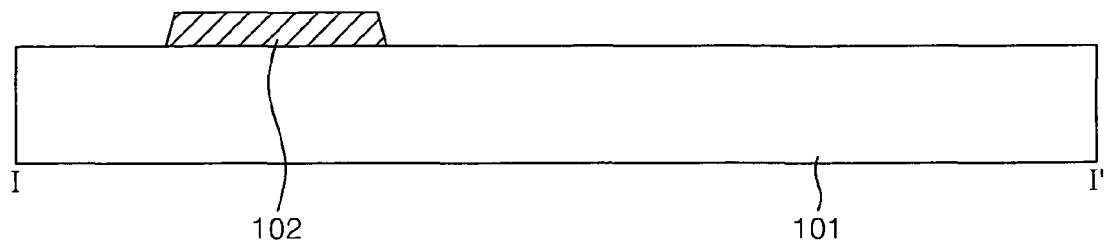
FIGS. 4A, 4B, and 4C are cross-sectional views, which are to explain forming a first conductive pattern group in a method of manufacturing the TFT substrate of FIG. 1.
Figure 4B:
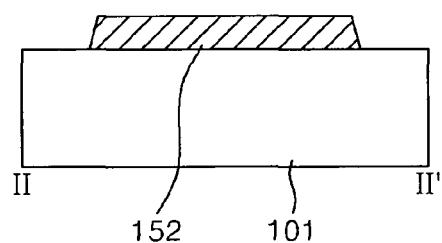
Figure 4C:
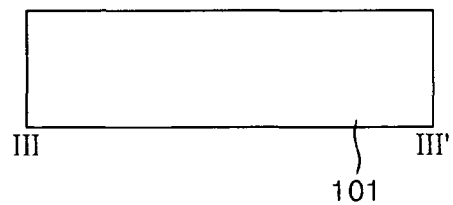

FIG. 3 is a plan view and FIGS. 4A, 4B, and 4C are cross-sectional views to explain forming a first conductive pattern group in a method of manufacturing the TFT substrate of FIG. 1.

Referring to FIGS. 3, 4A, 4B, and 4C, the first conductive pattern group including the gate line 104, the gate electrode 102 and the lower gate pad electrode 152 is formed on the lower substrate 101.

More specifically, a gate metal layer is deposited on the lower substrate 101 by deposition such as sputtering. The gate metal layer is patterned by photolithography and etching to form the first conductive pattern group including the gate line 104, the gate electrode 102 and the lower gate pad electrode 152. The gate metal layer may be formed of Al, Mo, Cr, or Cu.

Figure 5:
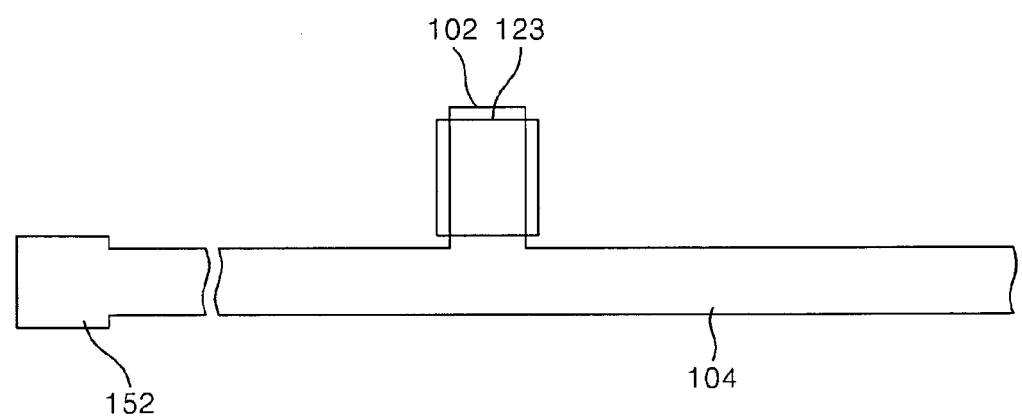
FIG. 5 is a plan view showing gate line 104, gate electrode 102 and oxide semiconductor layer 123.
Figure 6A:
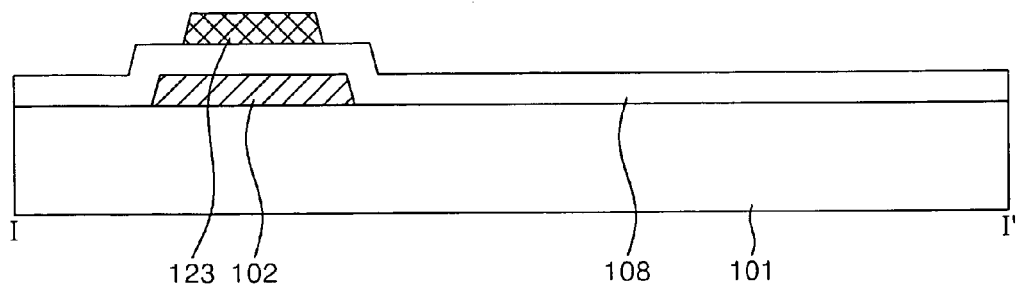
FIGS. 6A, 6B, and 6C are cross-sectional views which are useful for explaining formation of a gate insulating layer and an oxide semiconductor pattern in a method of manufacturing the TFT substrate of FIG. 1.
Figure 6B:
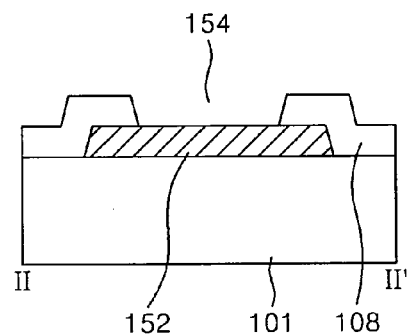
Figure 6C:
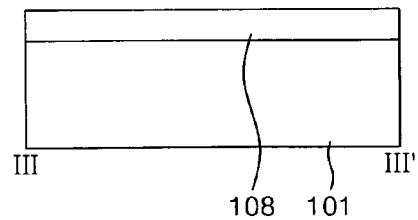

FIG. 5 is a plan view and FIGS. 6A, 6B, and 6C are cross-sectional views, which are to explain forming a gate insulating layer and an oxide semiconductor pattern in the method of manufacturing the TFT substrate of FIG. 1. FIGS. 7A, 7B, 7C, 8A, 8B, 8C, 9A, 9B, 9C, 10A, 10B, 10C, 11A, 11B, and 11C are cross-sectional views to explain in detail the method of manufacturing the TFT substrate shown in FIGS. 6A, 6B, and 6C.

Referring to FIGS. 5, 6A, 6B, and 6C, a gate insulating layer 108 is formed on the lower substrate 101 having the first conductive pattern group. An oxide semiconductor pattern 123 is then formed on the gate insulating layer 108. The oxide semiconductor pattern 123 is formed by a mask process using a diffractive exposure mask or a half-tone mask. In the following description, an example of using a first diffractive exposure mask 200 will be explained.

Figure 7A:
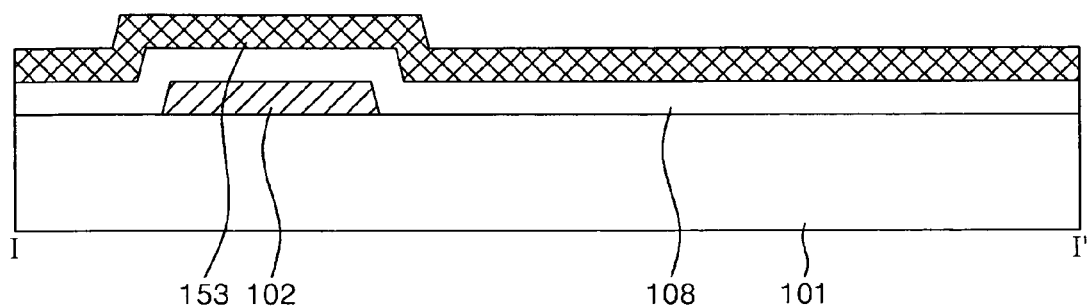
FIGS. 7A, 7B, 7C, 8A, 8B, 8C, 9A, 9B, 9C, 10A, 10B, 10C, 11A, 11B, and 11C are cross-sectional views useful for explaining in detail the method of manufacturing the TFT substrate shown in FIGS. 6A, 6B, and 6C.
Figure 7B:
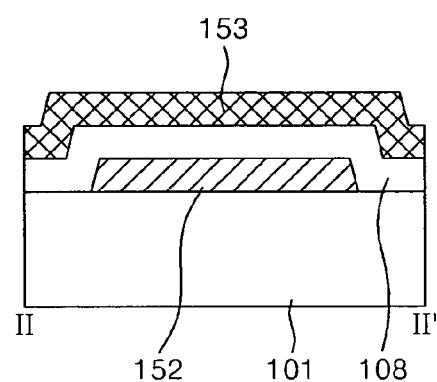
Figure 7C:
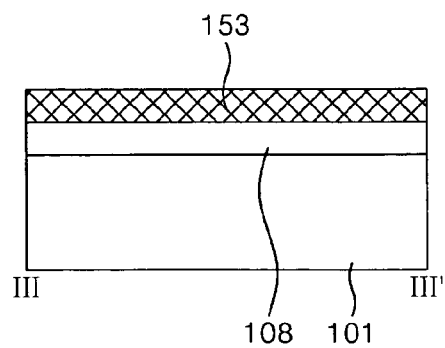

Referring to FIGS. 7A, 7B, and 7C, a gate insulating layer 108 and an oxide semiconductor layer 153 are formed on the lower substrate 101 having the first conductive pattern group. An inorganic insulating layer and an oxide semiconductor layer are sequentially deposited on a surface of the lower substrate 101 to form the gate insulating layer 108 and the oxide semiconductor layer 153. An inorganic insulating substance is used to form the gate insulating layer 108 by deposition such as PECVD (plasma enhanced chemical vapor deposition). The inorganic insulating substance includes silicon oxide ($SiO_x$), silicon nitride ($SiN_x$) or the like. The oxide semiconductor layer 153 is formed by deposition such as MOCVD (metal organic chemical vapor deposition), or sputtering. A zinc oxide based substance described above in detail may be used as the oxide semiconductor layer 153.

Figure 8A:
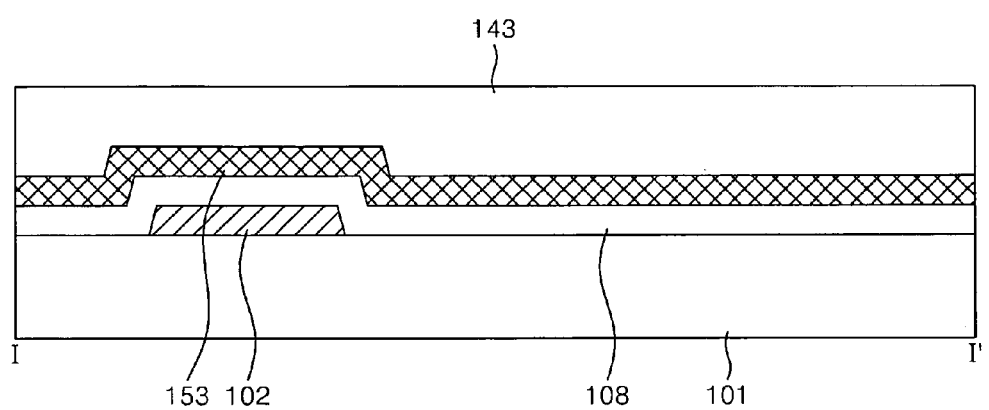
Figure 8B:
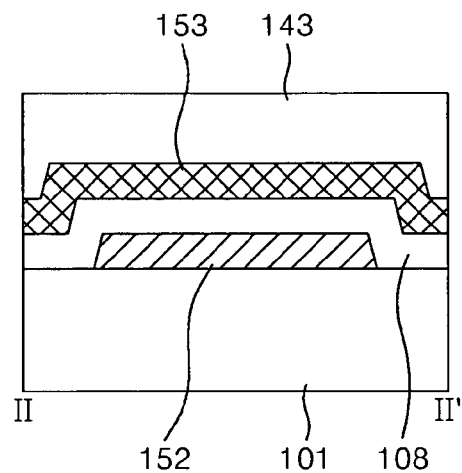
Figure 8C:
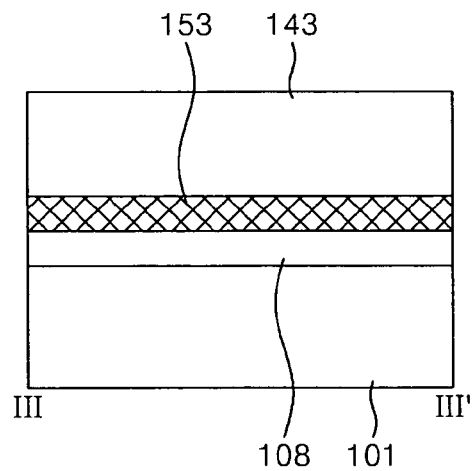
Figure 9A:
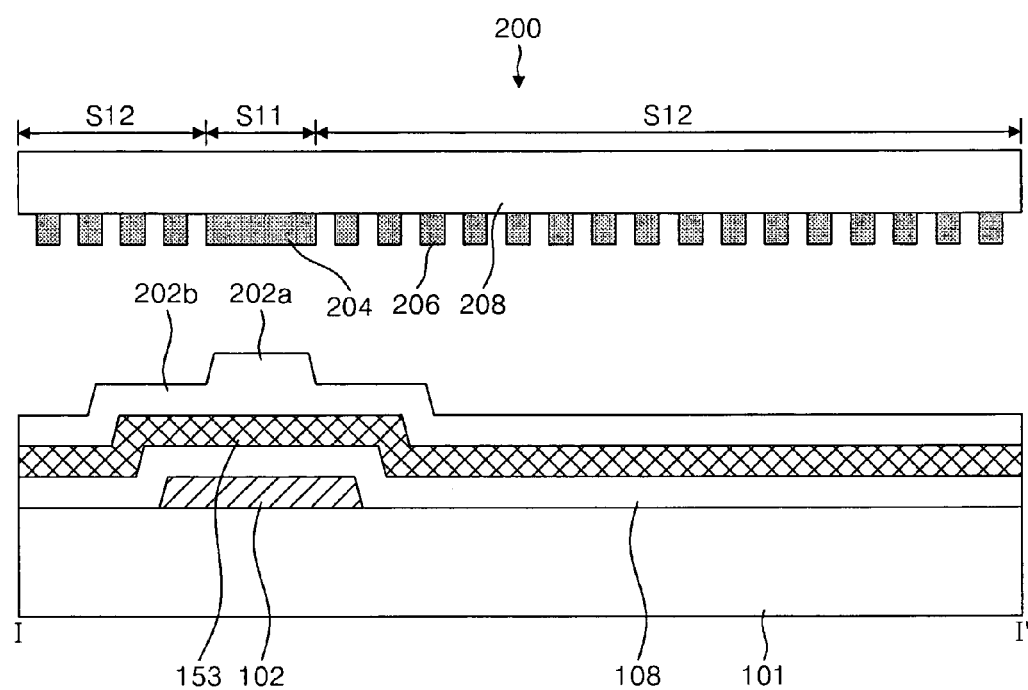
Figure 9B:
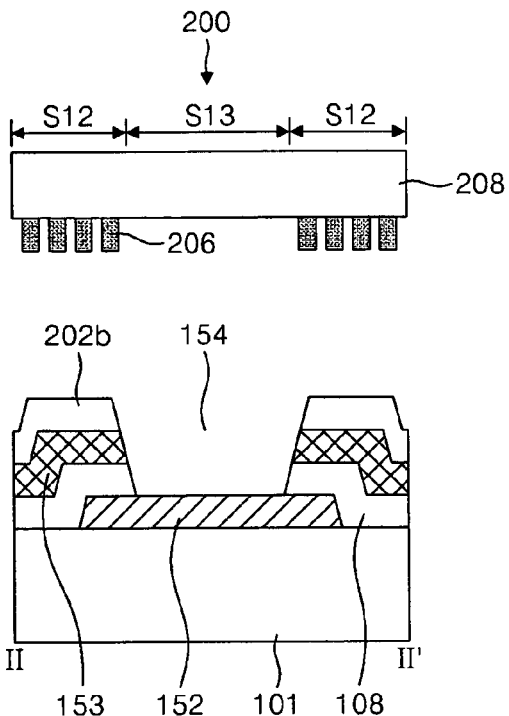
Figure 9C:
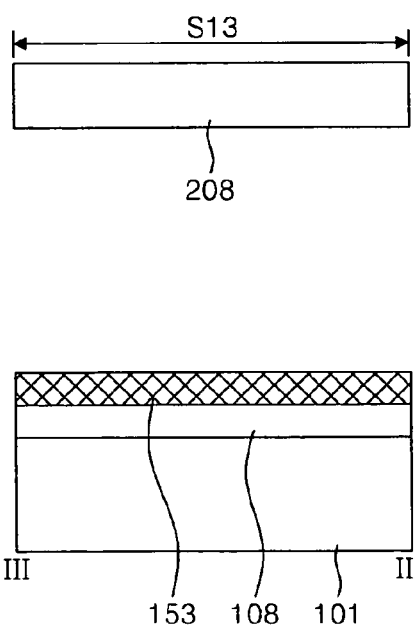

Referring to FIGS. 8A, 8B, and 8C, a photoresist layer 143 is fully deposited on the oxide semiconductor layer 153 by spin or spinless coating. Subsequently, the photoresist layer 143 is exposed and developed by photolithography using a first diffractive exposure mask 200 shown in FIG. 9A to form first and second photoresist patterns 202a and 202b which have different thicknesses, as shown in FIGS. 9A, 9B, and 9C.

The first diffractive exposure mask 200 includes a shield area S11 having a shield layer 204 formed on a quartz substrate 208, a slit area S12 having a plurality of slits 206 formed on the quartz substrate 208, and a transmissive area S13 where only the quartz substrate 208 is provided. The shield area S11 blocks ultraviolet rays in an area where the oxide semiconductor layer 153 is formed in order to leave the first photoresist pattern 202a after developing process, as shown in FIGS. 9A, 9B, and 9C. The slit area S12 diffracts the ultraviolet rays in an area except for the area for forming the oxide semiconductor pattern 153 and an area except for a portion for forming a gate pad contact hole 154 on the gate pad 150 in order to leave the second photoresist pattern 202b which is thinner than the first photoresist pattern 202a, after developing process. The transmissive area S13 transmits the ultraviolet rays in order to remove the photoresist on the gate pad 150.

A first photoresist pattern group including the first and second photoresist patterns 202a and 202b is formed using the first diffractive exposure mask 200. The oxide semiconductor layer 153 and the gate insulating layer 108 on the gate pad 150 are etched using the first photoresist pattern group as a mask to form the contact hole 154 on the gate pad 150.

Figure 10A:
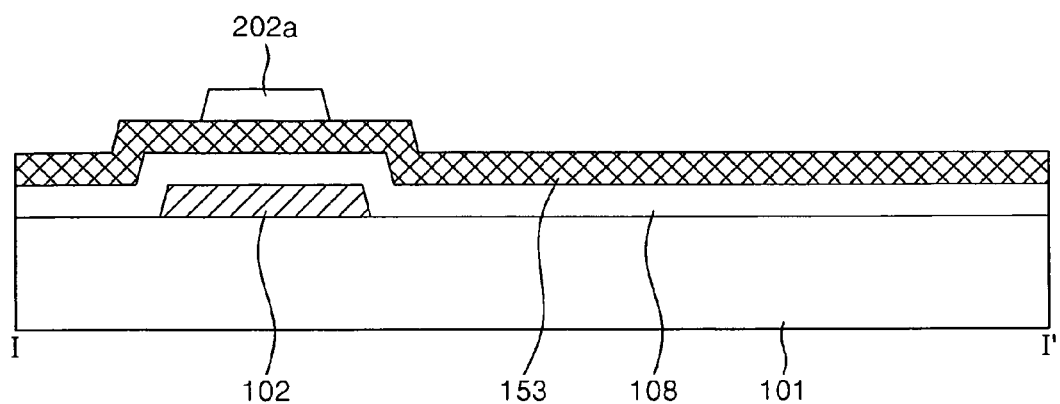
Figure 10B:
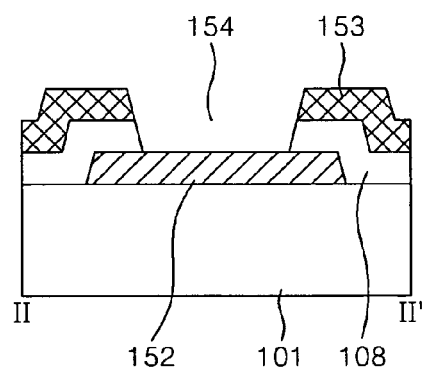
Figure 10C:
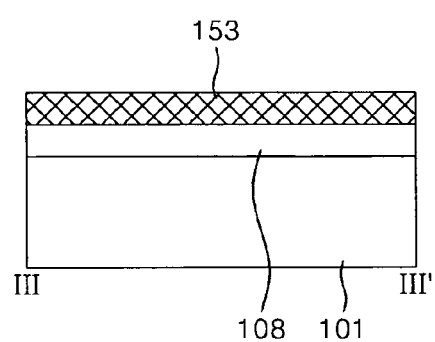

Referring to FIGS. 10A, 10B, and 10C, the first photoresist pattern group is etched to a predetermined thickness by $O_2$-plasma ashing to form a second photoresist pattern group. The second photoresist pattern group includes the first photoresist pattern group of which thickness is reduced. And the second photoresist pattern 202b is removed.

Figure 11A:
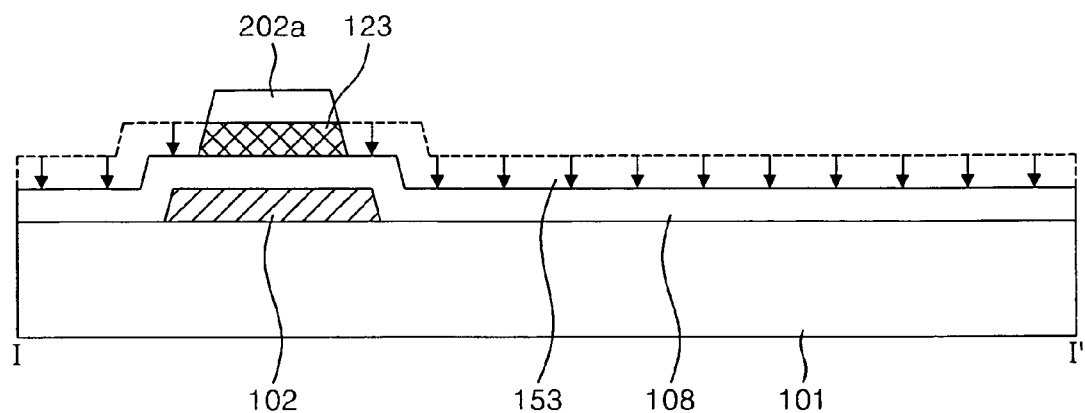
Figure 11B:
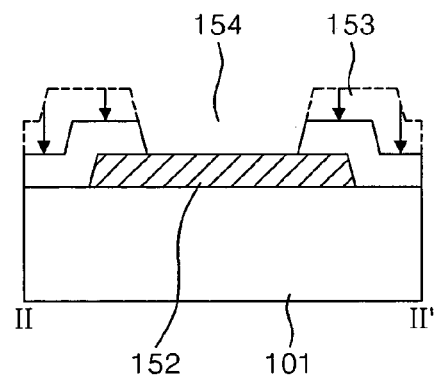
Figure 11C:
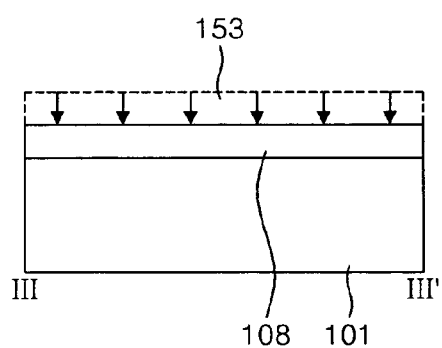

Referring to FIGS. 11A, 11B, and 11C, the oxide semiconductor layer 153 is etched using the ashed first photoresist pattern 202a as a mask. As a result, an oxide semiconductor pattern 123 is formed on the lower substrate 101 and the contact hole exposing the lower gate pad 152 is formed.

Figure 12:
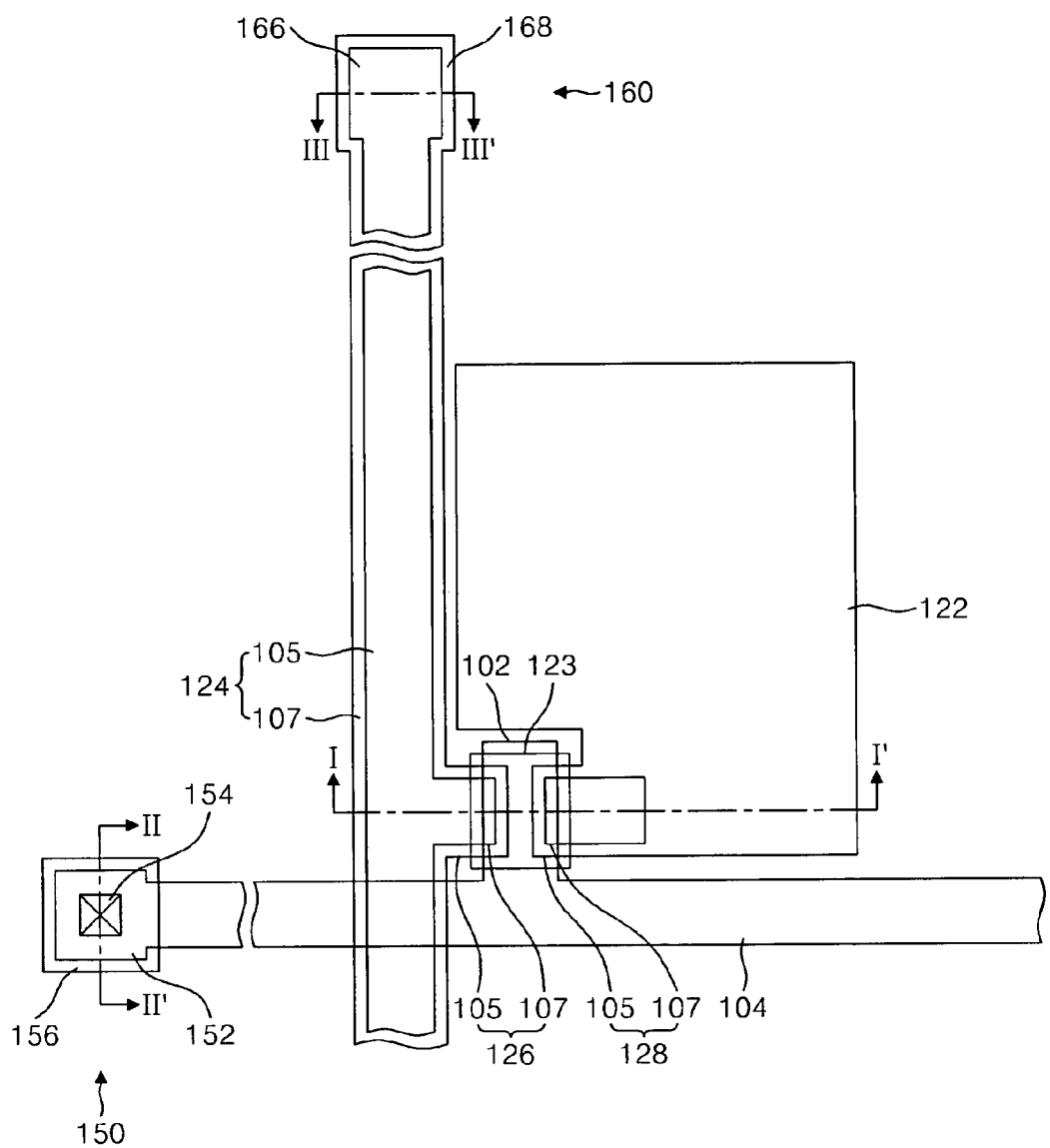
FIG. 12 is a plan view of an embodiment of the present invention.
Figure 13A:
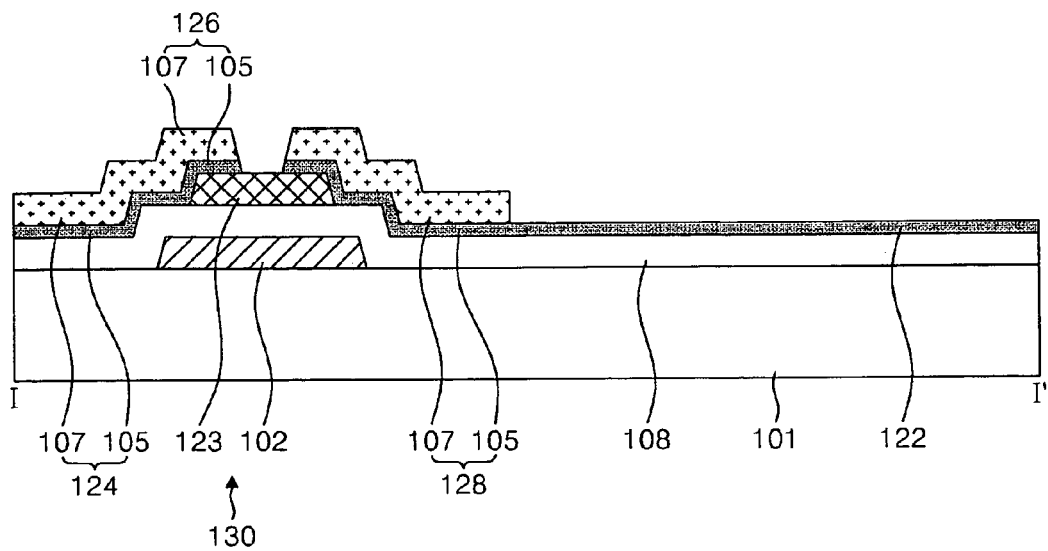
FIGS. 13A, 13B, and 13C are cross-sectional views useful for explaining formation of a second conductive pattern group in the method of manufacturing the TFT substrate of FIG. 1.
Figure 13B:
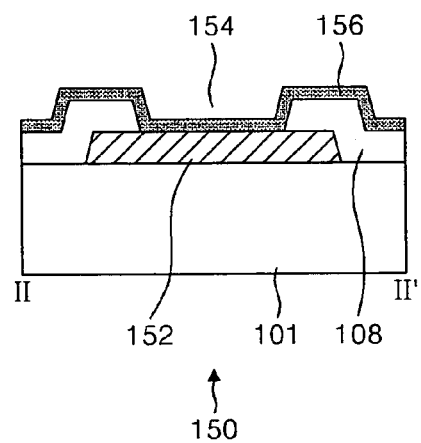
Figure 13C:
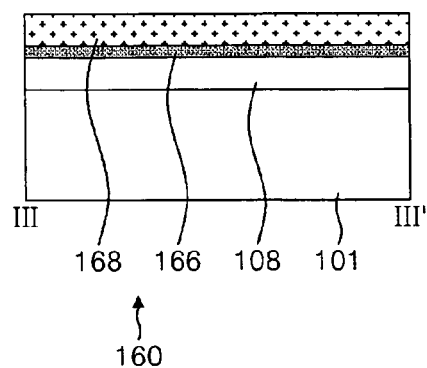

FIG. 12 is a plan view and FIGS. 13A, 13B, and 13C are cross-sectional views to explain forming a second conductive pattern group in a method of manufacturing the TFT substrate of FIG. 1. FIGS. 14A, 14B, 14C, 15A, 15B, 15C, 16A, 16B, 16C, 17A, 17B, and 17C are cross-sectional views to explain in detail the method of manufacturing the TFT substrate shown in FIGS. 13A, 13B, and 13C.

Referring to FIGS. 12, 13A, 13B, and 13C, the second conductive pattern group including source and drain electrodes 126 and 128, a pixel electrode 122, an upper gate pad electrode 156, and upper and lower data electrodes 166 and 168 are formed on the lower substrate 101 having the oxide semiconductor layer 123. The second conductive pattern group is formed by a mask process using a diffractive exposure or half-tone mask. In the following description, a case of using a second diffractive exposure mask will be explained.

Figure 14A:
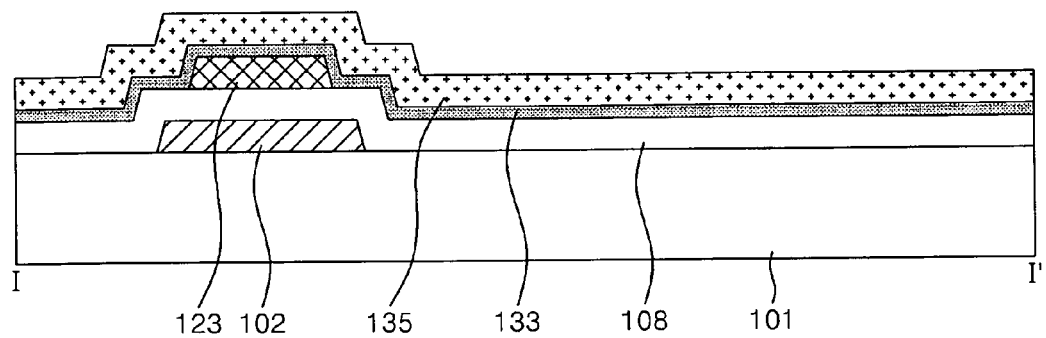
Figure 14B:
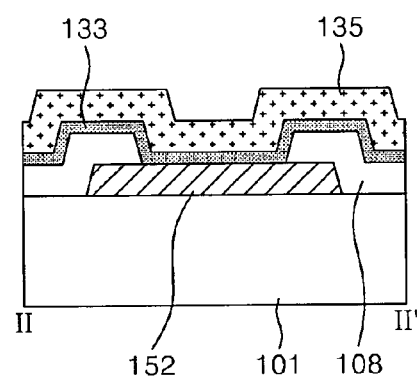
Figure 14C:
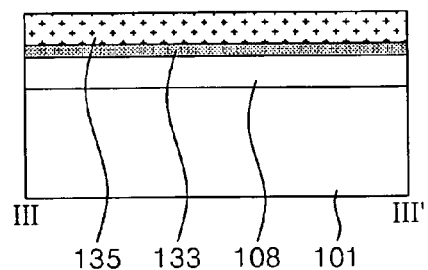

Referring to FIGS. 14A, 14B, and 14C, a first conductive layer 133 and a second conductive layer 135 are formed by deposition such as sputtering on the lower substrate 101 on which the oxide semiconductor layer 123 is formed. The first conductive layer 133 may be formed of ITO (Indium Tin Oxide) or IZO (Indium Zinc Oxide). The second conductive layer 135 may be formed of Cu, Mo, Al, Ti, Al—Ni alloy, Cu alloy, Mo alloy, or Al alloy.

Figure 15A:
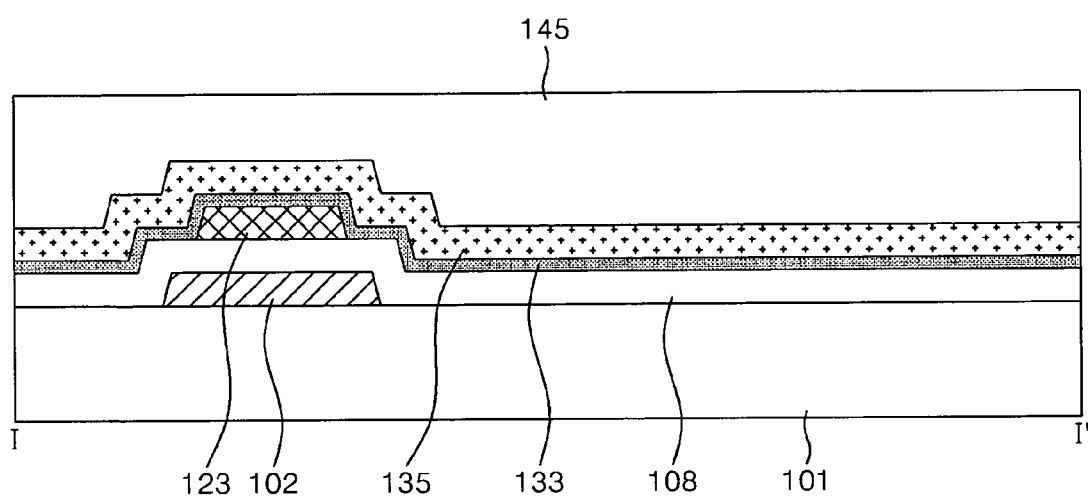
Figure 15B:
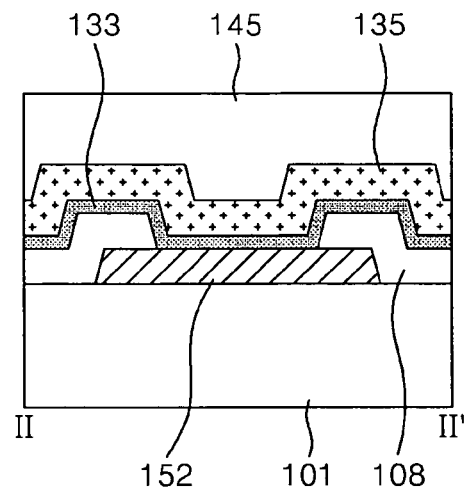
Figure 15C:
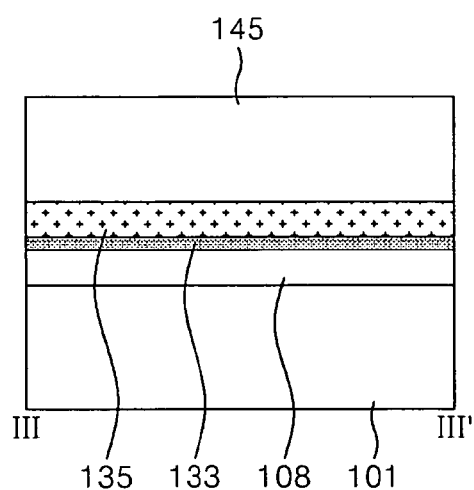

Referring to FIGS. 15A, 15B, and 15C, a photoresist 145 is fully deposited over the first and second conductive layers 133 and 135 by spinless or spin coating. Exposure and development are then carried out on the photoresist 145 by photolithography using a second diffractive exposure mask 210 shown in FIG. 16A and FIG. 16B to form third and fourth photoresist patterns 212a and 212b which have different thicknesses, as shown in FIGS. 16A, 16B, and 16C.

The second diffractive exposure mask 210 includes a shield area S21 having a shield layer 214 formed on a quartz substrate 218, a slit area S22 having a plurality of slits 216 formed on the quartz substrate 218, and a transmissive area S23 where only the quartz substrate 218 is provided. The shield area S21 blocks ultraviolet rays from an area where source and drain electrodes 126 and 128 are to be formed in order to leave the third photoresist pattern 212a after developing process, as shown in FIGS. 16A, 16B, and 16C. The slit area S22 diffracts the ultraviolet rays in an area where the pixel electrode 122 and the upper gate pad electrode 156 are formed in order to leave the fourth photoresist pattern 212b which is thinner than the third photoresist pattern 212a, after developing process. And the transmissive area S23 transmits the ultraviolet rays in order to remove the photoresist after developing process.

Figure 16A:
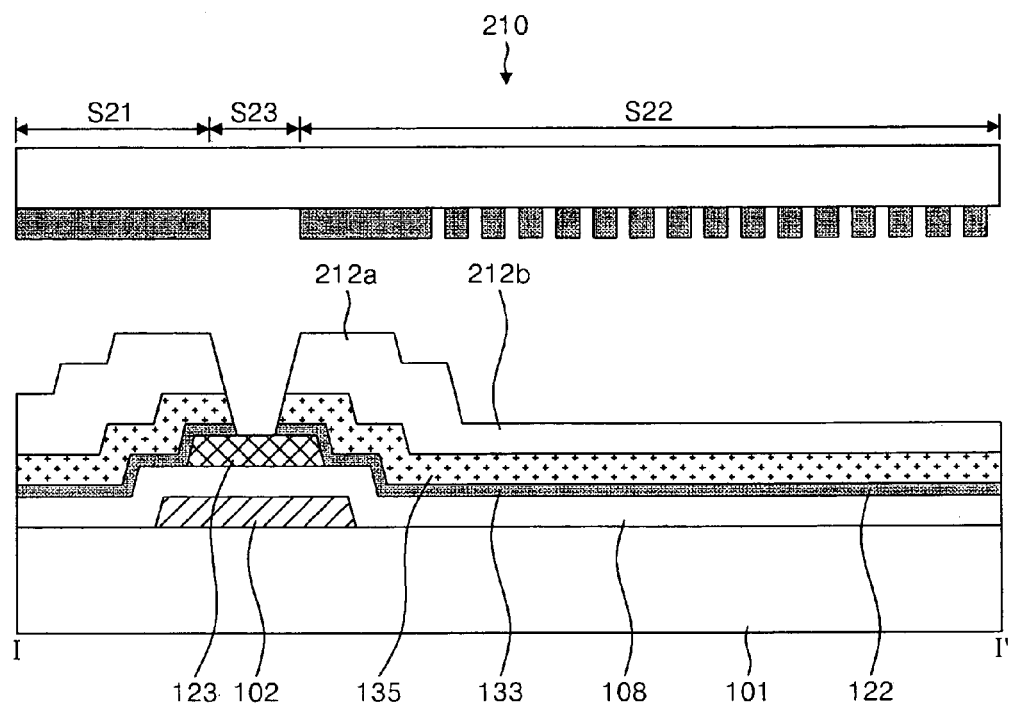

The first and second conductive layers 105 and 107, as shown in FIGS. 16A, 16B, and 16C, are patterned by an etching process using the third and fourth photoresist patterns 212a and 212b as a mask to expose the oxide semiconductor layer 123.

Figure 17A:
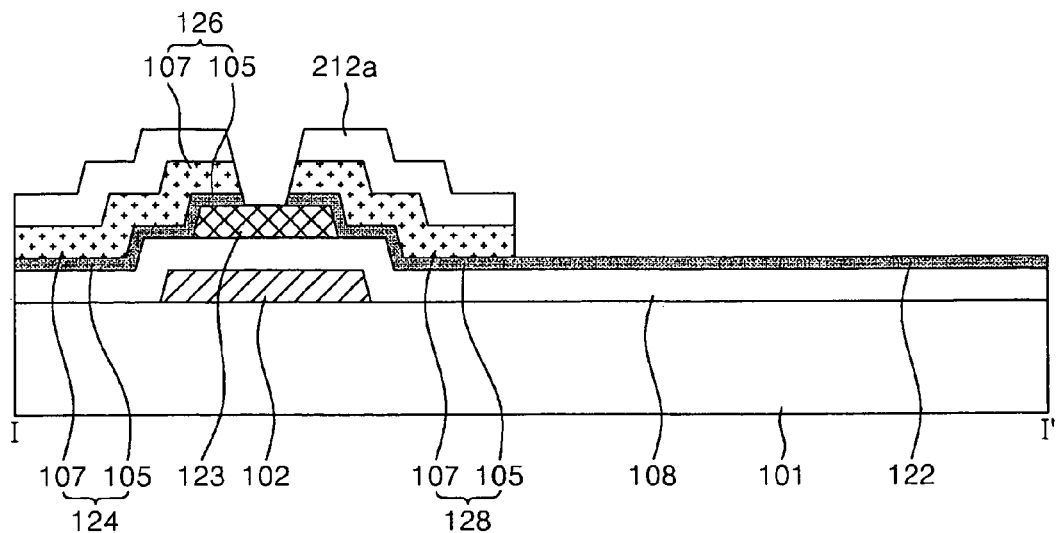
Figure 17B:
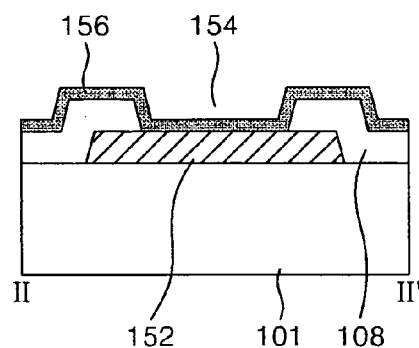
Figure 17C:
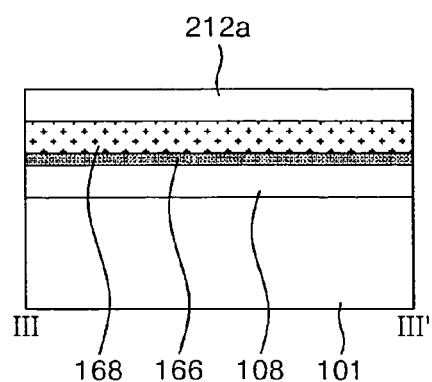

Referring to FIGS. 17A, 17B, and 17C, the third photoresist pattern 212a is reduced in thickness and the fourth photoresist pattern 212b is removed, by $O_2$-plasma ashing. The second conductive layer 107 is then removed by an etching process using the ashed third photoresist pattern 212a as a mask. Source and drain electrodes 126 and 128 formed of the first and second conductive layers 105 and 107 are provided, and a pixel electrode 122 and an upper gate pad electrode 156 formed of the first conductive layer 105 are formed. The pixel electrode formed of an amorphous transparent electrode 133 is put into a furnace to be processed at a high temperature to polymerize the transparent electrode 133. Finally, the third photoresist pattern 212a is stripped off from the source and drain electrodes 126 and 128 and the upper and lower data electrodes 166 and 168.

Figure 18:
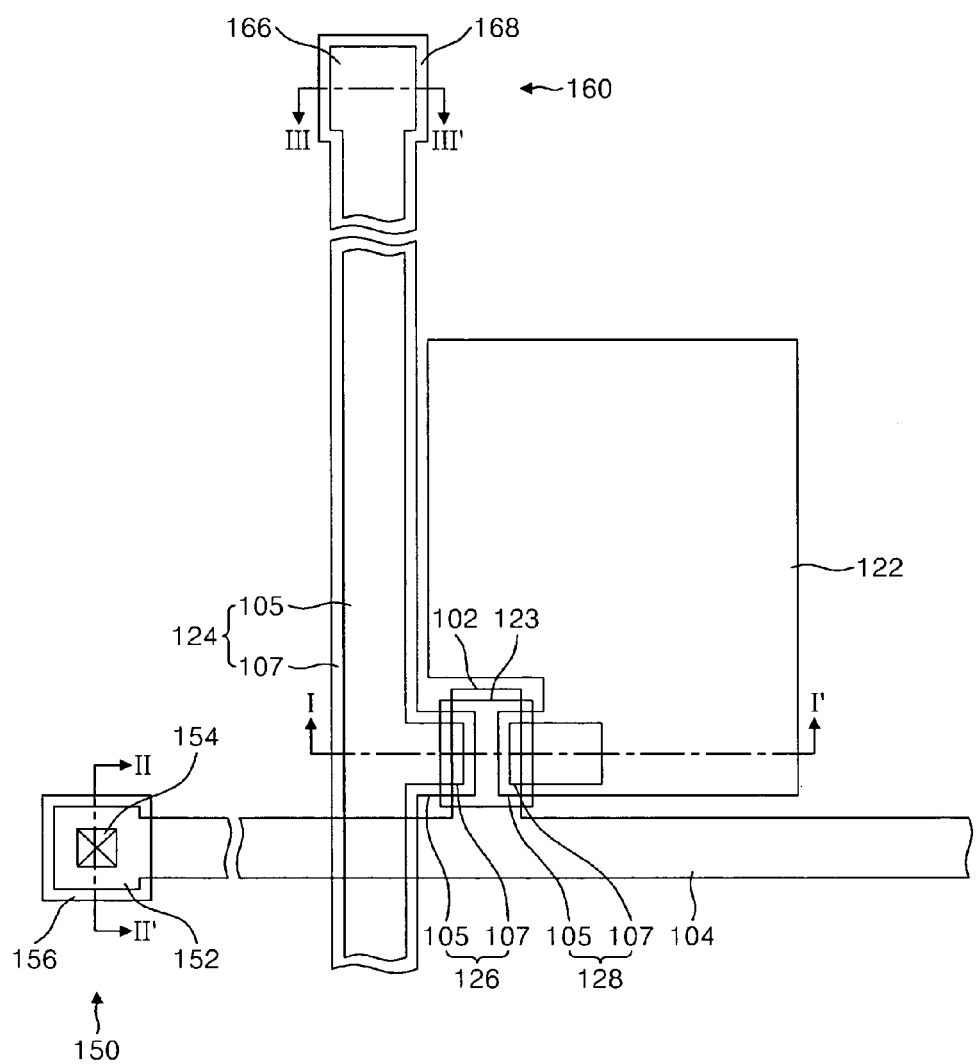
FIG. 18 is a plan view of an embodiment of the present invention and FIGS. 19A, 19B, and 19C are cross-sectional views useful for explaining formation of a column spacer in the method of manufacturing the TFT substrate of FIG. 1.
Figure 19A:
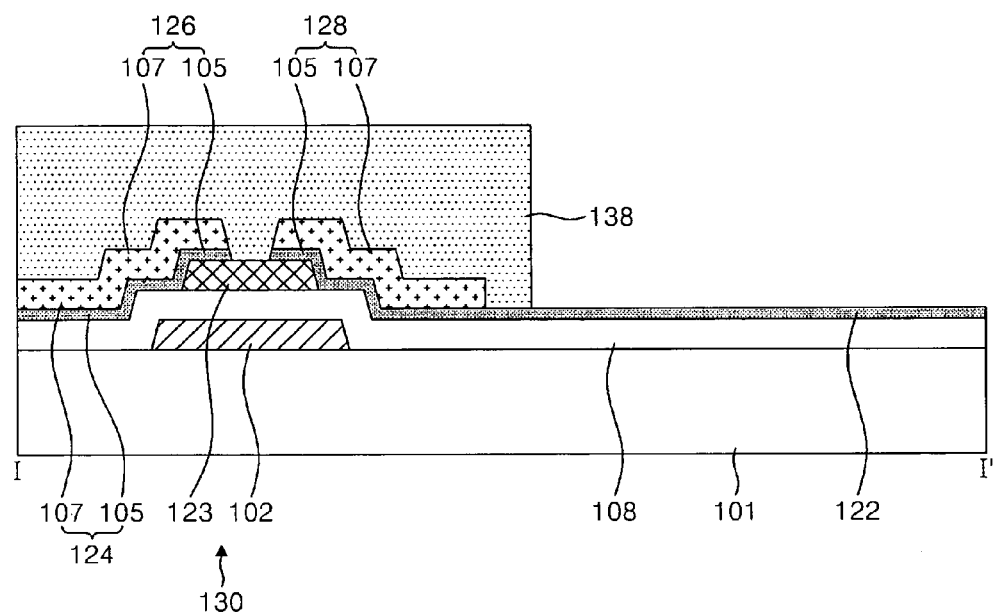
Figure 19B:
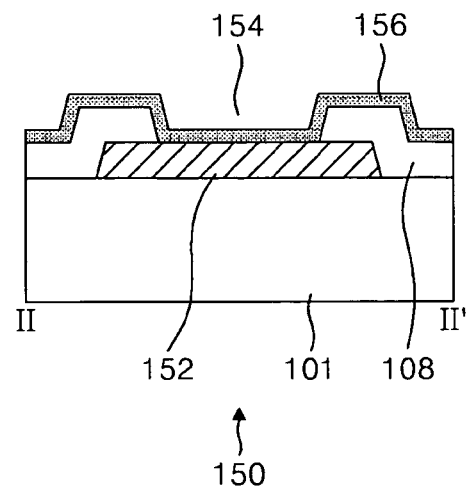
Figure 19C:
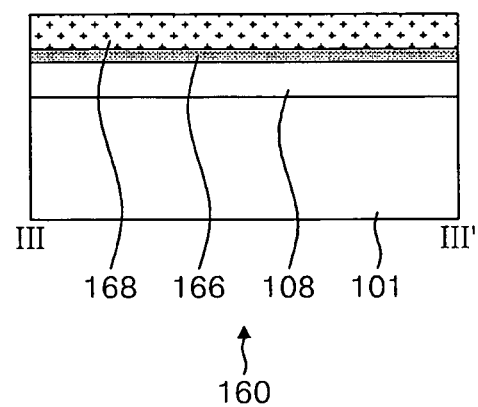

FIG. 18 is a plan view and FIGS. 19A, 19B, and 19C are cross-sectional views, which are to explain forming a column spacer in a method of manufacturing the TFT substrate of FIG. 1.

Referring to FIGS. 18, 19A, 19B, and 19C, an organic passivation layer is formed by spin or spinless coating over the lower substrate 101 having the second conductive pattern group. The organic passivation layer is formed of an organic insulating substance such as acryl. The organic passivation layer is then patterned by photolithography and etching process to form the column spacer 138.

As described above, source and drain electrodes include a first conductive layer facilitating a contact with an oxide semiconductor layer and a second conductive layer having low resistance, thereby preventing a signal delay from being caused by a resistance increased by a large-scale area. Further, one of the source/drain electrodes is extended to form a pixel electrode, thereby simplifying a manufacturing process. In addition, the first and second conductive layers include a transparent electrode and a low-resistance metal layer, respectively, thereby reducing a material cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a thin film transistor substrate, comprising:
    forming on a surface of a substrate a first conductive pattern group including a gate line, a gate electrode, and a gate pad electrode;
    forming a gate insulating layer on the surface of the substrate on which the first conductive pattern group is formed;
    forming on the gate insulating layer an oxide semiconductor pattern overlapping the gate electrode;
    sequentially forming a first conductive layer and a second conductive layer on the surface of the substrate on which the oxide semiconductor pattern is formed, the first conductive layer formed of a transparent conductive material, and the second conductive layer formed of a metal material; and
    patterning the first and second conductive layers to form a second conductive pattern group including a data line, a source electrode, a drain electrode, and a data pad and to form a pixel electrode, the pixel electrode integrally formed with the first conductive layer of the drain electrode.

2. The method of claim 1, further comprising forming a pixel electrode connected to the drain electrode, the pixel electrode being formed of the first conductive layer in an area defined by an intersection of the gate line and the data line.

3. The method of claim 1, wherein the first conductive layer contacts the oxide semiconductor pattern in an area where the source electrode and the drain electrode are formed.

4. The method of claim 1, wherein the first conductive layer is formed of: polycrystalline indium tin oxide, indium tin oxide or indium zinc oxide.

5. The method of claim 1, wherein the second conductive layer is formed of a material selected from the group consisting of Cu, Mo, Al, Ti, Al—Ni alloy, Cu alloy, Mo alloy, and Al alloy.

6. The method of claim 1, wherein the oxide semiconductor pattern comprises an oxide semiconductor layer including a zinc oxide based substance.

7. The method of claim 6, wherein forming the oxide semiconductor pattern comprises:
    forming an oxide semiconductor layer on the gate insulating layer;
    forming on the oxide semiconductor layer first and second photoresist patterns which have different thicknesses;
    forming a contact hole exposing the lower gate pad electrode by etching the oxide semiconductor layer and the gate insulating layer using the first and second photoresist patterns as a mask;
    removing the thinner one of the first and second photoresist patterns by ashing the first and second photoresist patterns; and
    forming the oxide semiconductor pattern by removing the oxide semiconductor layer exposed via a portion of the removed second photoresist pattern.

8. The method of claim 1, wherein the forming the second conductive pattern group further comprises polymerizing an amorphous transparent electrode by thermally treating the first conductive layer at high temperature.

9. The method of claim 1, further comprising forming a column spacer made of an organic insulating layer on the source electrode and the drain electrode.

10. A thin film transistor substrate comprising:
    a substrate;
    a thin film transistor formed on the substrate, the thin film transistor comprising:
        a first conductive pattern group formed on the substrate, the first conductive pattern group comprising a gate line and a gate electrode;
        a gate insulating layer formed on the substrate to cover the first conductive pattern group;
        an oxide semiconductor layer overlapping the gate electrode on the gate insulating layer; and
        a second conductive pattern group comprising a data line, a source electrode, and a drain electrode, each of the data line, the source electrode and the drain electrode comprising a first conductive layer and a second conductive layer on the oxide semiconductor layer and the gate insulating layer, the first conductive layer formed of a transparent conductive material, and the second conductive layer formed of a metal material; and
    a pixel electrode integrally formed with the first conductive layer of the drain electrode.

11. The thin film transistor substrate of claim 10, the first conductive layer is formed of polycrystalline indium tin oxide, indium tin oxide or indium zinc oxide.

12. The thin film transistor substrate of claim 10, wherein the second conductive layer is formed of a material selected from the group consisting of Cu, Mo, Al, Ti, Al—Ni alloy, Cu alloy, Mo alloy, and Al alloy.

13. The thin film transistor substrate of claim 10, further comprising a gate pad formed at one end of the gate line, wherein the gate pad is comprised of a lower gate pad electrode and an upper gate pad electrode that is connected to the lower gate pad electrode and formed of the first conductive layer.

14. The thin film transistor substrate of claim 10, further comprising a column spacer formed of an organic insulating layer on the thin film transistor.

15. The thin film transistor substrate of claim 10, wherein the oxide semiconductor layer comprises a zinc oxide.

16. The thin film transistor substrate of claim 10, further comprising a data pad formed at one end of the data line.

17. The thin film transistor substrate of claim 14, wherein the column spacer is in direct contact with the oxide semiconductor layer.

* * * * *